United States Patent [19]

Maeda et al.

[11] Patent Number: 4,720,914
[45] Date of Patent: Jan. 26, 1988

[54] METHOD FOR FORMING THICK FILM CIRCUIT USING ROTATABLE NOZZLE HAVING WIDE DISCHARGE HOLE

[75] Inventors: Yukio Maeda; Shinichi Kudou; Akira Kabeshita, all of Osaka, Japan

[73] Assignee: Matsushita Electric Industrial Co., Ltd., Japan

[21] Appl. No.: 841,865

[22] PCT Filed: Jul. 26, 1984

[86] PCT No.: PCT/JP84/00380
§ 371 Date: Mar. 10, 1986
§ 102(e) Date: Mar. 10, 1986

[87] PCT Pub. No.: WO86/01067
PCT Pub. Date: Feb. 13, 1986

[51] Int. Cl.⁴ .............................................. H05K 3/20
[52] U.S. Cl. ...................................... 29/846; 228/4.5
[58] Field of Search ................... 29/846, 851; 228/4.5; 427/96

[56] References Cited

U.S. PATENT DOCUMENTS 4,291,642  9/1981  Kolc .

FOREIGN PATENT DOCUMENTS 0113979  7/1984  European Pat. Off. .

Primary Examiner—Timothy V. Eley
Attorney, Agent, or Firm—Lowe, Price, LeBlanc, Becker & Shur

[57] ABSTRACT

The present invention relates to method and apparatus for forming a thick film circuit by discharging a thick film paste from a paste discharging hole of a drawing nozzle and drawing a desired pattern on a substrate. The paste discharging hole has a substantially wide configuration and the drawing nozzle is rotated about its axis of rotation so that the longitudinal direction of the elongated cross-section of the paste discharging hole is substantially normal to the direction in which the drawing nozzle is moved with respect to the substrate.

6 Claims, 9 Drawing Figures

METHOD FOR FORMING THICK FILM CIRCUIT USING ROTATABLE NOZZLE HAVING WIDE DISCHARGE HOLE

TECHNICAL FIELD

The present invention relates to method and apparatus for forming a thick film circuit which is capable of being adapted for use in broadcasting radio receivers, television receivers, communication equipment, measuring control equipment, and so on, and to a method for forming a thick film circuit which is capable of accurately drawing a thin and wide line in a short time.

BACKGROUND OF THE INVENTION

A thick film circuit has been hitherto formed in accordance with the screen printing method for mass production, and it has also been attempted to form such a thick film circuit by means of the drawing method using a drawing nozzle. When beginning a manufacturing process, the screen printing method requires the design and manufacture of a screen for each thick film circuit, and therefore this method take a long time to complete. On the other hand, the drawing method does not require such screens and therefore a new circuit pattern can be made in a short time. This makes it possible to shorten the time period required for development of a new circuit pattern manufacturing process A conventional drawing method is illustrated in FIG. 1, where a drawing nozzle 3 has a circular paste discharging hole 4 for discharging a thick film paste 1 and is relatively moved with respect to a substrate 2 to thereby apply the thick film paste 1 on a surface of the substrate 2 so as to form a desired circuit pattern. This drawing method is useful for drawing a narrow line. FIG. 2 is an illustration of an end portion of the drawing nozzle 3. Generally, the paste discharging hole 4 has a diameter of 100 to 300 $\mu$m. FIG. 3 is an illustration of the cross-section of the paste drawn by the drawing nozzle 3 having a circular paste discharging hole, which cross-section is measured by a surface roughness measuring device after burning. As seen from FIG. 3, the configuration of the cross-section is a semicircle and the thickness of the center portion is greater than the edge portions. Therefore, in cases where a wide line is drawn by increasing the diameter of the nozzle, the thickness thereof increases, with accompanying disadvantages. Particularly, in a laser trimming process performed for adjusting the resistance value of a resistor paste after burning, the large thickness of the line causes difficulties during the trimming process. Even if the trimming is performed by increasing the output of the laser or in a slow manner, a micro-crack occurs in the resistor portion due to the high temperature required and therefore the resistance value varies with time, resulting in low reliability. Generally, the resistor paste is less than 12 $\mu$m in film thickness after burning and is about 1.0 mm in width. Using the circular paste discharging hole and keeping the film thickness to less than 12 $\mu$m, the maximum width of a line is only 150 $\mu$m. In order to eliminate this problem a method has been hitherto employed in which a thin and wide line is formed by drawing a plurality of narrow lines close to each other. However, this method takes a long time, and the thickness of the connection portions becomes uneven and the resistance value becomes unstable, resulting in a deterioration in quality.

DISCLOSURE OF THE INVENTION

The present invention relates to a method for forming a thick film circuit by discharging the thick film paste from the paste discharging hole and drawing a desired shape on a substrate, wherein the drawing nozzle has a substantially wide paste discharging hole and is rotated about its axis so that the longitudinal direction of the paste discharging hole is maintained substantially kept at right angles to the direction that the drawing nozzle is moved with respect to the substrate. Since the drawing nozzle according to the present invention has a substantially wide paste discharging hole, a thin and wide pattern can be drawn by one stroke, or required, by several strokes. Furthermore, since the drawing nozzle is arranged to be freely rotated, the drawing can efficiently be made in optional directions by one drawing head. In addition, since the center of rotation of the drawing nozzle substantially passes through the center of the paste discharging hole, preferably, with an error smaller than 0.05 mm, the rotation of the drawing nozzle does not cause a variation in the position of the center of the paste discharging hole relative to the substrate irrespective of the change drawing direction. Therefore, when the drawing nozzle is rotated for the purpose of changing the drawing direction, it is not required to correct the position on coordinate relative to the substrate. It is required that the axis of rotation be arranged at substantially right angles to the substrate. If not so arranged, the film thickness in the line width direction becomes uneven and the film thickness can be varied by the rotation of the drawing nozzle. It is preferred that the cross-section of the paste discharging hole has a configuration substantially elongated in a direction, such as a rectangular or an elliptical configuration. It is alternatively preferred that a plurality of small circular holes are arranged in one or two lines to form a substantially wide paste discharging hole.

An apparatus for forming a thick film circuit for the present invention comprises a drawing head, an X-Y drive section for relative movement of the drawing head with respect to a substrate, and a control section having a microprocessor therein for controlling each device. The drawing head has a drawing nozzle at the end portion thereof, which drawing nozzle has a paste discharging hole. The drawing nozzle is arranged to be movable about an axis perpendicular to the substrate under instructions from the control section and the center of the paste discharging hole is substantially coincident with the center of rotation of the drawing nozzle. More preferably, at least either of the drawing head or a substrate holding section has an up-and-down drive device for changing the distance between the drawing nozzle and the substrate. In the present invention, the X-Y drive section is provided at either of the substrate holding section of the drawing head.

The thick film paste applicable to the present invention is a known conductor paste comprising metallic powder, glass frit, resin, organic solvent and so on, a known resistor paste with ruthenium oxide or another metallic oxide instead of the metallic powder, or a known dielectric substance paste. These pastes are generally burned at a temperature of 800° to 900° and it is also appropriate to use a known cold cure type thick film paste comprising, for example, resin and metallic powder or resin and carbon.

MOST PREFERRED EMBODIMENT OF THE PRESENT INVENTION

Figure 1:
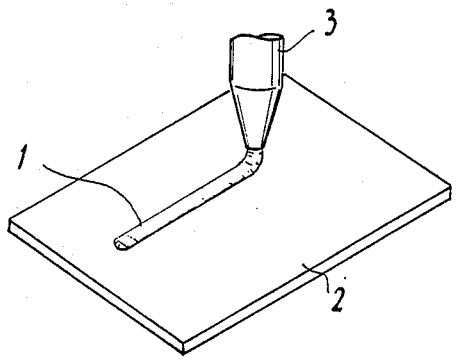
FIG. 1 is a perspective view illustrating a conventional prior art method for forming a thick film circuit.
Figure 2:
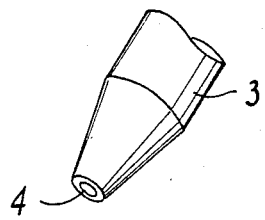
FIG. 2 is a perspective view showing the end portion of the drawing nozzle of FIG. 1.
Figure 3:
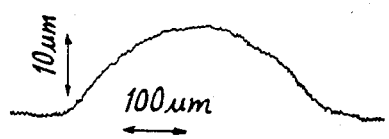
FIG. 3 is an illustration for describing the cross-section of paste drawn in accordance with the prior art.
Figure 4:
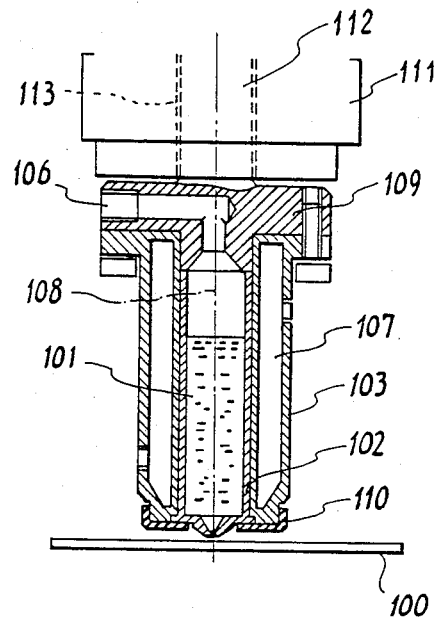
FIG. 4 is a cross-sectional view of a drawing head section according to an embodiment of the present invention.
Figure 5:
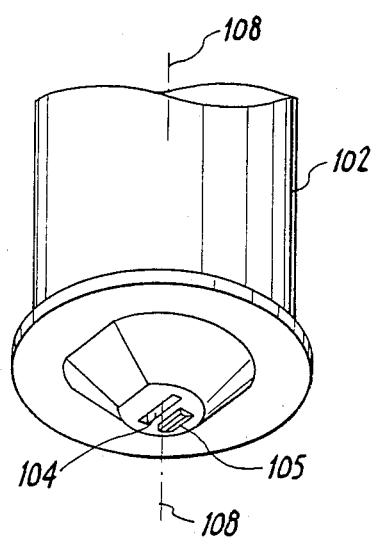
FIG. 5 is a perspective view of the end portion of paste tank of FIG. 4.

The embodiments of the present invention will be described with reference to FIGS. 4 to 8. In the drawings, a thick film paste 101 is provided in a drawing nozzle 102 acting as a paste tank and the drawing nozzle 102 is inserted into a head 103 and is attached thereto by a screw cap 110. The head 103 has a water jacket 107 performing circulation of constant-temperature water for keeping the temperature of the thick film paste 101 constant and is fixedly secured to a head base 109 by means of screws. The head base 109 has an air supplying inlet 106 for discharging the thick film paste 101 and a shaft 112 integrally attached to the head base 109. The shaft 112 is inserted into a passing-through hole 113 provided in a bracket 111 and is arranged to be freely rotated about the axis of rotation 108. The shaft 112 is associated with a servomotor (not shown) provided on the opposite side of the head 103 with respect to the passing-through hole 113 and therefore the head base 109 can be rotated. The drawing nozzle is of cylindrical shape and has a paste discharging hole 104 at the end portion thereof, the discharging cross-section size of which is 1 mm×0.1 mm, thereby making it possible to efficiently draw a wide circuit pattern. The axis of rotation 108 is positioned to coincide with the center of the paste discharging hole 104. A diamond tip 105 is provided in the vicinity of the paste discharging hole 104 for constantly maintaining the distance between the the paste discharging hole 104 and a substrate 100.

Figure 6:
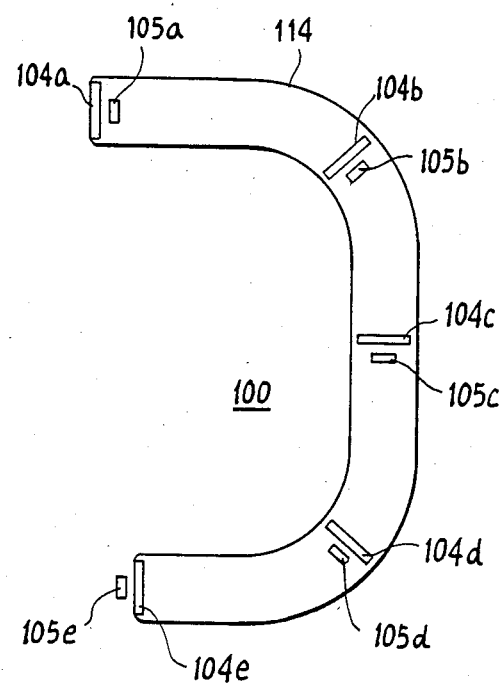
FIG. 6 is an illustration for describing a method for forming a thick film circuit according to an embodiment of the present invention.

To draw a conductor pattern 114 as shown in FIG. 6, the head base 109 is rotated at the time of the drawing operation by the servomotor so that the longitudinal direction of the elongated cross-section of paste discharging hole 104 is substantially normal to the direction in which the drawing nozzle 102 is moved with respect to the substrate 100, followed by bringing the drawing nozzle 102 close to the substrate 100. Thereafter, the thick film paste 101 is discharged from the paste discharging hole 104 by means of air pressure and at approximately the same time the drawing nozzle 102 is moved in the direction parallel to the substrate 100 to draw the conductor pattern 114 on the substrate 100. In this case, the drawing nozzle 102 can move in optional directions by the X-Y drive section under control of a computer, and as illustrated in FIG. 6 the direction and position of the paste discharging hole 104 are varied as indicated by references 104a, 104b, 104c, 104d, 104e so that the longitudinal direction of the paste discharging opening 104 is always the direction substantially normal to the direction of movement with respect to the substrate. The diamond tip 105 always goes first in the paste discharging hole moving direction and the direction and position of the diamond tip 105 is varied as indicated by the references 105a, 105b, 105c, 105d, and 105e. On reaching the end of drawn pattern, the air pressure is removed to terminate the discharging of the thick film paste and the drawing nozzle is lifted. Therefore, due to the rotation of the drawing nozzle 102, the line width of the circuit pattern becomes constant and it is not required to correct the relative coordinate of the drawing nozzle 102 relative to the substrate 100 in accordance with the direction of the paste discharging hole 104 because the position of the center of the paste discharging hole 104 relative to the substrate 100 is not varied irrespective of the change of the direction of the discharging hole 104.

Figure 7:
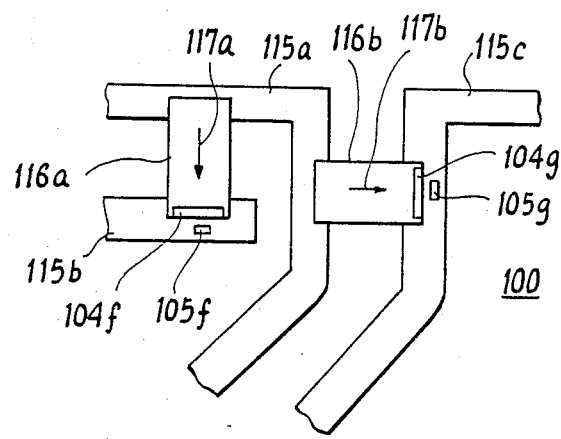
FIG. 7 is a plan view illustrating a method for forming a thick film circuit according to another embodiment of the present invention.
Figure 8:
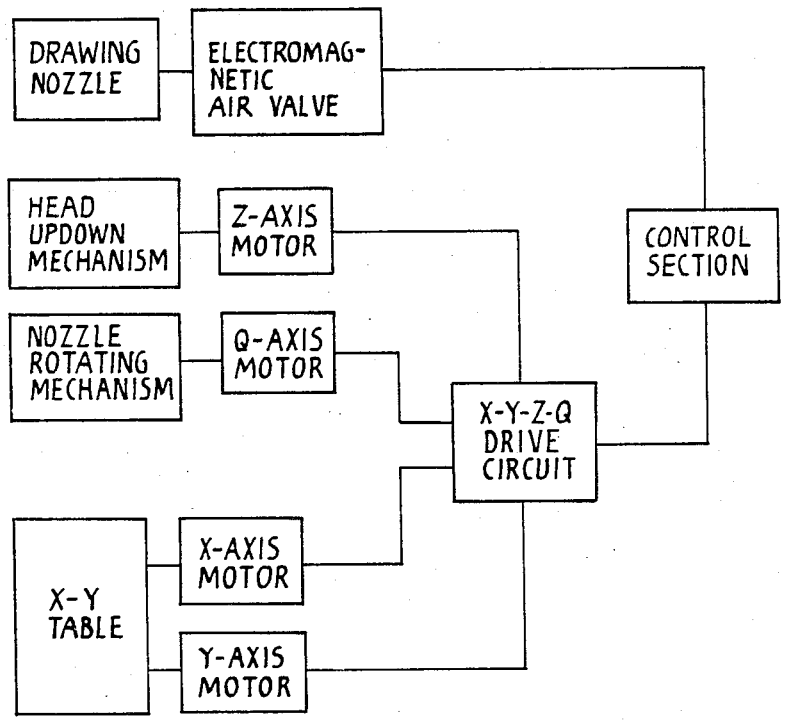
FIG. 8 is a diagram illustrating a control system for the method of forming a thick film circuit according to the embodiments of the present invention.
Figure 9:
FIG. 9 is an illustration of a cross-sectional profile found by a surface roughness measuring device after burning.

To draw resistor patterns 116a and 116b illustrated in FIG. 7, the head base 109 is rotated by the servomotor at the time of the drawing operation so that the longitudinal direction of the paste discharging hole 104 is substantially perpendicular to the direction in which the drawing nozzle 102 is moved with resect to the substrate 100, and the drawing nozzle 102 is arranged close to a predetermined position on the substrate 100 on which conductor patterns 115a to 115c have been formed. Thereafter, the thick film paste 101 is discharged from the paste discharging hole 104 by means of air pressure and substantially at the same time the drawing nozzle 102 is moved with respect to the substrate 100 in a drawing direction 117a to draw a resistor pattern 116a on the substrate 100. In this case, a diamond tip 105f goes first in the drawing direction in relation to a paste discharging hole 104f. On reaching the end of the drawing pattern, the air pressure is removed to stop discharging the paste and the drawing nozzle is lifted, so that the drawing of the resistor pattern 116a is terminated. The head base 109 is rotated by the servomotor to change the direction of the drawing nozzle 102 counterclockwise by 90 degrees and the drawing nozzle 102 is similarly moved in a drawing direction 117b to draw the resistor pattern 116b. Therefore, due to rotation of the drawing nozzle 102, the resistor drawing in different directions can be achieved by using only one drawing nozzle. Furthermore, the center of the paste discharging hole 104 is coincident with the axis of rotation 108 and therefore it is not required to correct the coordinate of the drawing nozzle 102 relative to the substrate 100. Control for the embodiments of the present invention is illustrated in FIG. 8. FIG. 9 shows the cross-sectional profile of the resistor pattern drawn as illustrated in FIG. 7, which is measured by a surface roughness measuring device after burning.

INDUSTRIAL APPLICATION

As described above, according to the present invention, since a wide paste discharging hole is freely rotated so that the longitudinal direction thereof is normal to a drawing direction, a circuit is efficiently drawn on a substrate in optional directions by one drawing nozzle.

Furthermore, since the axis of rotation of the drawing nozzle substantially passes through the center of the paste discharging hole, it is not required to correct the coordinate irrespective of rotation of the drawing nozzle. This invention is useful for industrial applications.

What is claimed is:

1. A method for forming a thick film circuit on a substrate, comprising discharging a thick film past from a paste discharging hole provided at one end of a drawing nozzle to draw a desired pattern, said paste discharging hole having a substantially wide configuration in a longitudinal direction and said drawing nozzle being freely rotatable about an axis of rotation so that the longitudinal direction of said paste discharging hole is normal to the direction in which said drawing nozzle is moved with respect to said substrate.

2. A method as claimed in claim 1, wherein the axis of rotation of said drawing nozzle substantially passes through the center of said paste discharging hole.

3. A method as claimed in claim 2, wherein the cross-section of said paste discharging hole has a rectangular or an elliptical configuration.

4. A method as claimed in claim 1, wherein the cross-section of said paste discharging hole has a rectangular or an elliptical configuration.

5. A method as claimed in claim 1, wherein the drawing of a thick film pattern comprises the successively and repeatedly executed steps of:

rotating said drawing nozzle during the operation so that the longitudinal direction of said paste discharge hole is substantially at a right angle with respect to the direction in which said drawing nozzle is moved with respect to said substrate;

brining said drawing nozzle close to said substrate at a desired position;

forming a thick film pattern on said substrate by discharging said thick film paste from said paste discharging hole while moving said drawing nozzle in a direction parallel to said substrate;

terminating the discharging of said thick film paste at the end of the drawing operation; and separating said drawing nozzle from said substrate.

6. A method as claimed in claim 5, wherein the step of forming a thick film pattern comprises drawing a curved pattern portion by controlling the direction of movement of said drawing nozzle so that the longitudinal direction of said paste discharging hole continually intersects at substantially a right angle the direction in which said drawing nozzle is moved with respect to said substrate.

* * * * *